US 8,385,114 B2

(12) United States Patent
Sugiyama et al.

(10) Patent No.: US 8,385,114 B2
(45) Date of Patent: Feb. 26, 2013

(54) NONVOLATILE MEMORY CIRCUIT USING SPIN MOS TRANSISTORS

(75) Inventors: Hideyuki Sugiyama, Kawasaki (JP);
Tetsufumi Tanamoto, Kawasaki (JP);
Takao Marukame, Tokyo (JP); Mizue Ishikawa, Yokohama (JP); Tomoaki Inokuchi, Yokohama (JP); Yoshiaki Saito, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/360,904

(22) Filed: Jan. 30, 2012

(65) Prior Publication Data

US 2012/0119274 A1        May 17, 2012

Related U.S. Application Data

(62) Division of application No. 12/889,881, filed on Sep. 24, 2010, now Pat. No. 8,154,916.

(30) Foreign Application Priority Data

Feb. 8, 2010   (JP) ................. 2010-025821

(51) Int. Cl.
*G11C 11/14*    (2006.01)
(52) U.S. Cl. ................ 365/171; 365/154; 365/158
(58) Field of Classification Search .......... 365/171, 365/154, 156, 158
See application file for complete search history.

(56) References Cited

U.S. PATENT DOCUMENTS

| | | | |
|---|---|---|---|
| 6,717,844 B1 | 4/2004 | Ohtani | |
| 2006/0114018 A1* | 6/2006 | Sugahara et al. | 326/36 |
| 2011/0273925 A1* | 11/2011 | Yamamoto et al. | 365/154 |

FOREIGN PATENT DOCUMENTS

| | | |
|---|---|---|
| JP | 2007-052879 | 3/2007 |
| JP | 2009-171007 | 7/2009 |
| WO | WO 03/105156 A1 | 12/2003 |

OTHER PUBLICATIONS

Satoshi Sugahara, et al., "Spin MOSFETs as a Basis for Spintronics", ACM Transactions on Storage, vol. 2, No. 2, May 2006, pp. 197-219.
Japanese Office Action issued Jan. 31, 2012, in Patent Application No. 2010-025821 (English-language translation only).
Shuu'ichirou Yamamoto, et al., "Nonvolatile Static Random Access Memory Using Magnetic Tunnel Junctions with Current-Induced Magnetization Switching Architecture", Japanese Journal of Applied Physics, vol. 48, Apr. 20, 2009, pp. 043001-1-043001-7.

* cited by examiner

*Primary Examiner* — Huan Hoang
(74) *Attorney, Agent, or Firm* — Oblon, Spivak, McClelland, Maier & Neustadt, L.L.P.

(57) ABSTRACT

Certain embodiments provide a nonvolatile memory circuit in which a first p-channel MOS transistor and a first n-channel spin MOS transistor are connected in series, a second p-channel MOS transistor and a second n-channel spin MOS transistor are connected in series, gates of the first p-channel MOS transistor and the first n-channel spin MOS transistor are connected, gates of the second p-channel MOS transistor and the second n-channel spin MOS transistor are connected, a first n-channel transistor includes a drain connected to a drain of the first p-channel transistor and the gate of the second p-channel transistor, a second n-channel transistor includes a drain connected to a drain of the second p-channel transistor and the gate of the first p-channel transistor, and gates of the first and second n-channel transistors are connected.

5 Claims, 13 Drawing Sheets

US 8,385,114 B2

NONVOLATILE MEMORY CIRCUIT USING SPIN MOS TRANSISTORS

CROSS-REFERENCE TO RELATED APPLICATION

This application is a Division of and claims the benefit of priority under 35 U.S.C. §120 from U.S. Ser. No. 12/889,881, filed Sep. 24, 2010, and claims the benefit of priority under 35 U.S.C. §119 from prior Japanese Patent Application No. 2010-25821 filed on Feb. 8, 2010 in Japan, the entire contents of which are incorporated herein by reference.

FIELD

Embodiments described herein relate to a nonvolatile memory circuit using spin MOS transistors.

BACKGROUND

As miniaturization techniques have advanced in recent years, the power consumptions of LSI (Large-Scale Integrated) circuits have become larger, and the standby power consumptions of semiconductor memories cannot be ignored these days. In a LSI circuit, a power-gating technique is being used to cut off the power supply to portions not being used, and supply power only to portions being used. Where a memory circuit is manufactured by a semiconductor CMOS technique, volatile SRAMs (Static Random Access Memories) are used as the memories for storing information. Since SRAMs are volatile, the power supply cannot be cut off during a standby time, and therefore, the power consumption becomes larger. Also, since SRAMs are volatile, the memory information is lost when the power supply is abruptly cut off. Where a large number of SRAMs are used, the power consumption becomes larger due to a leakage current, even when there is not an operation being performed. As a result, a circuit that cannot easily reduce its power consumption and cannot easily be highly-integrated is formed. Further, since SRAMs are volatile memories from which information is lost when the power supply is cut off, it is necessary to write information supplied from an external memory every time the power supply is activated. Therefore, time and effort are required when the power supply is activated. Also, the external memory for storing the information while the power supply is off needs to be secured, and the power consumption and the volume for the external memory are required. This is one of the factors that hinder high integration and low power consumptions in the entire system.

As a nonvolatile memory circuit based on a currently-available semiconductor technique, a nonvolatile memory of a variable resistance type has been suggested. A nonvolatile memory of a variable resistance type causes a SRAM as a semiconductor memory to store information when the power supply is activated. Since a nonvolatile memory retains information even when the power supply is cut off, the power can be cut off while neither a reading operation nor a writing operation is being performed. In other words, if a nonvolatile memory is used in a LSI circuit, power gating can be readily performed. In view of this, attention is being drawn to nonvolatile memories of the variable resistance type.

In recent years, spin electronics devices that utilize the spin freedom of electrons have been actively studied and developed. Particularly, techniques based on tunnel magnetoresistance (TMR) effects have been actively studied and developed, and are now applied to magnetic random access memories (MRAMs) and the reproduction heads of hard disk drives (HDDs). Further, attention is being drawn to spin transistors that combine semiconductors and ferromagnetic materials.

A ferromagnetic material can have a nonvolatile memory function. Therefore, if used as nonmagnetic memories, ferromagnetic materials may be applied to the power-gating technique or memory backup. A nonvolatile memory circuit using ferromagnetic tunnel junction (MTJ) devices has been suggested as a nonvolatile memory.

In the nonvolatile memory circuit, MTJ devices are series-connected to MOS transistors within an inverter loop. Therefore, the operation margin becomes much lower, and high reliability cannot be achieved.

In a nonvolatile memory circuit using MTJ devices, the contents stored in the memory are determined by the resistance values of the MTJ devices observed when the power supply is activated. However, when the power voltage is low, the resistance of each MOS transistor is very high. Therefore, the influence of the resistance values of the MTJ devices is very small. As a result, false operations tend to be often caused due to variations in resistance value among the MOS transistors when the power voltage is low, and therefore, high reliability cannot be achieved.

DETAILED DESCRIPTION

Figure 1:
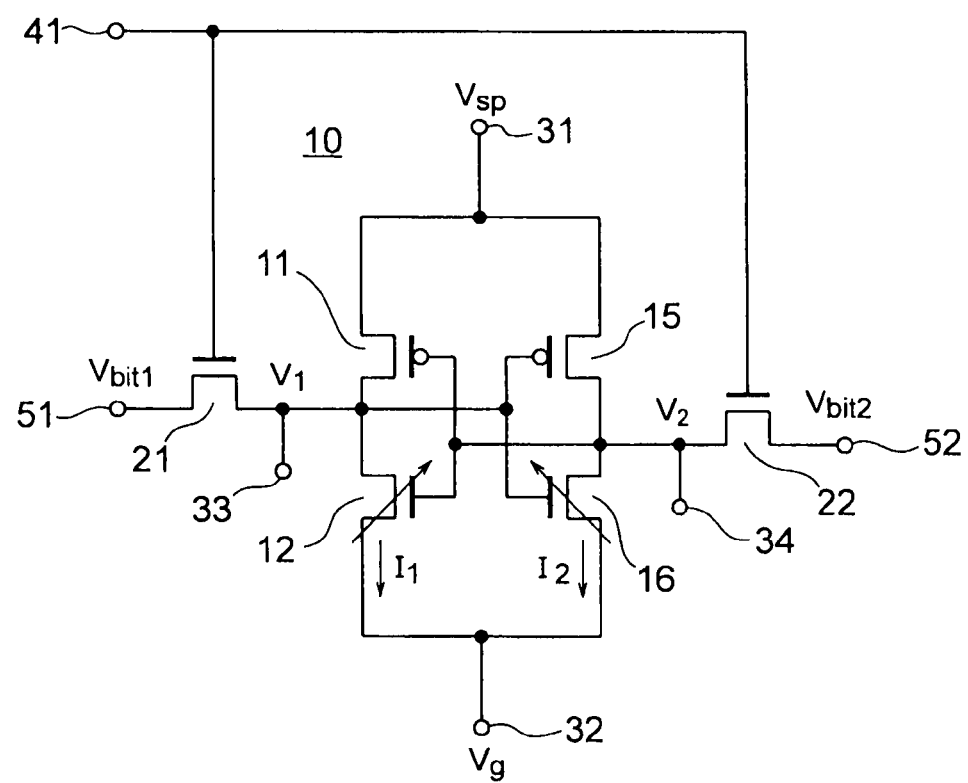
FIG. 1 is a circuit diagram showing a memory cell of a nonvolatile memory circuit according to a first embodiment.

Certain embodiments provide a nonvolatile memory circuit including: a first p-channel MOS transistor including a first source/drain electrode and a second source/drain electrode, the first source/drain electrode being connected to a first wiring line; a second p-channel MOS transistor including a third source/drain electrode and a fourth source/drain electrode, the third source/drain electrode being connected to the first wiring line, the fourth source/drain electrode being connected to a gate of the first p-channel MOS transistor, the second p-channel MOS transistor including a gate connected to the second source/drain electrode of the first p-channel MOS transistor; a first n-channel spin MOS transistor including a fifth source/drain electrode and a sixth source/drain electrode, the fifth source/drain electrode being connected to a second wiring line, the sixth source/drain electrode being connected to the second source/drain electrode of the first p-channel MOS transistor, the first n-channel spin MOS transistor including a gate connected to the fourth source/drain electrode of the second p-channel MOS transistor; a second n-channel spin MOS transistor including a seventh source/drain electrode and an eighth source/drain electrode, the seventh source/drain electrode being connected to the second wiring line, the eighth source/drain electrode being connected to the fourth source/drain electrode of the second p-channel MOS transistor, the second n-channel spin MOS transistor including a gate connected to the second source/drain electrode of the first p-channel MOS transistor; a first n-channel MOS transistor including a ninth source/drain electrode and a tenth source/drain electrode, the ninth source/drain electrode being connected to the second electrode of the first p-channel MOS transistor, the tenth source/drain electrode being connected to a third wiring line, the first n-channel MOS transistor including a gate connected to a fourth wiring line; and a second n-channel MOS transistor including an eleventh source/drain electrode and a twelfth source/drain electrode, the eleventh source/drain electrode being connected to the fourth source/drain electrode of the second p-channel MOS transistor, the twelfth source/drain electrode being connected to a fifth wiring line, the second n-channel MOS transistor including a gate connected to the fourth wiring line. A source/drain electrode may function as a source electrode or may function as a drain electrode. The source and drain electrodes are included in a source and a drain of a MOS transistor respectively.

The following is a detailed description of embodiments, with reference to the accompanying drawings. However, it should be noted that the drawings are merely schematic, and the sizes of the respective components, voltages, durations of time, size ratios between components, ratios between voltages, time intervals, and the likes differ from those in reality. Also, even in drawings showing the same component, the size and scale might vary in some parts.

As for signal voltages, a high voltage is indicated as H-level, and a low voltage is indicated as L-level. The H-level represents a higher voltage than a half a power voltage Vdd, and the L-level represents a lower voltage than a half the power voltage Vdd.

First Embodiment

FIG. 1 shows a memory cell of a nonvolatile memory circuit according to a first embodiment. The nonvolatile memory circuit of this embodiment includes a memory cell 1, and this memory cell 1 includes a memory unit 10 and two pass transistors 21 and 22 formed with n-channel MOS transistors.

The memory unit 10 includes p-channel MOS transistors 11 and 15, and n-channel spin MOS transistors 12 and 16. The p-channel MOS transistor 15 has substantially the same electrical characteristics as the p-channel MOS transistor 11, and the n-channel spin MOS transistor 16 has substantially the same electrical characteristics as the n-channel spin MOS transistor 12. Here, "having substantially the same electrical characteristics" means that the electrical characteristics of transistors of the same size are within an allowable range determined by specifications.

A spin MOS transistor (also called a spin MOSFET; the same applies in the following) has a ferromagnetic layer in each of the source electrode and the drain electrode of a conventional MOS transistor (MOSFET) structure. The characteristics of the spin MOS transistor vary with the magnetization directions of the two ferromagnetic layers formed in the source electrode and the drain electrode, and provide a memory function. In other words, the resistance value between the two ferromagnetic layers varies with the relative magnetization directions of the two ferromagnetic layers formed in the source electrode and the drain electrode. The magnetization direction of one of the two ferromagnetic layers formed in the source electrode and the drain electrode can be more readily reversed than the magnetization direction of the other one in a case where a spin-polarized current flows between the source electrode and the drain electrode, and the one of the two ferromagnetic layers is called the free magnetization layer (or the free layer). The magnetization direction of the other one of the two ferromagnetic layers is not readily reversed, and the other one of the two ferromagnetic layers is called the fixed magnetization layer (or the pinned layer). The magnetization directions of the ferromagnetic layers of the source electrode and the drain electrode in the spin MOS transistor are either substantially parallel to each other or substantially antiparallel to each other, and the resistance between the two ferromagnetic layers is either in a low-resistance state or a high-resistance state. In a case where a stack structure is formed by stacking ferromagnetic layers interposing a nonmagnetic layer in the source electrode or the drain electrode, the magnetization direction shows the magnetization direction of the ferromagnetic layer closest to the semiconductor substrate in which the source electrode or the drain electrode is formed, or the magnetization direction of the ferromagnetic layer closest to the semiconductor layer.

The respective sources of the p-channel MOS transistors 11 and 15 are connected to a node 31, and the respective sources of the n-channel spin MOS transistors 12 and 16 are connected to a node 32. The respective drains of the p-channel MOS transistor 11 and the n-channel spin MOS transistor 12 are connected to a node 33, and the respective drains of the p-channel MOS transistor 15 and the n-channel spin MOS transistor 16 are connected to a node 34. The respective gates of the p-channel MOS transistor 11 and the n-channel spin MOS transistor 12 are connected to the node 34, and the respective gates of the p-channel MOS transistor 15 and the n-channel spin MOS transistor 16 are connected to the node 33.

The pass transistors 21 and 22 have substantially the same electrical characteristics. One of the source and drain of the pass transistor 21 is connected to the node 33, and the other one is connected to a node 51. One of the source and drain of the pass transistor 22 is connected to the node 34, and the other one is connected to a node 52. The respective gates of the pass transistors 21 and 22 are connected to a node 41. The node 41 is connected to a wiring line for selecting the memory cell 1, such as a word line, and the nodes 51 and 52 are connected to wiring lines from which the information stored in the memory cell 1 is to be read, such as two bit lines.

In this embodiment, one of the two spin MOS transistors 12 and 16 is set in a low resistance state, and the other one is set in a high resistance state. For example, in the following description, the spin MOS transistor 12 is set in a high resistance state, and the spin MOS transistor 16 is set in a low resistance state.

Figure 2:
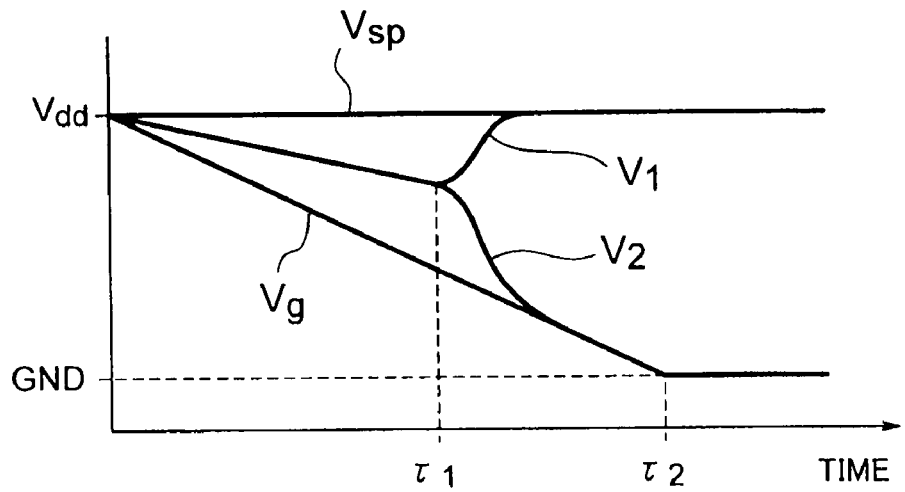
FIG. 2 is a timing chart showing a first method for determining the state of the information stored in the memory cell.

Referring now to FIG. 2, the rising operation characteristics of the memory cell 1 of the first embodiment are described when the power supply is switched on. The voltage of the node 31 is represented by Vsp, the voltage of the node 32 is represented by Vg, the voltage of the node 33 is represented by V1, and the voltage of the node 34 is represented by V2. In FIG. 2, the horizontal axis indicates time, and the vertical axis indicates voltage.

The current from the node 31 to the node 32 flows either in a path extending through the spin MOS transistor 12 or in a path extending through the spin MOS transistor 16. As described above, in this embodiment, the spin MOS transistor 12 is set in a high resistance state, and the spin MOS transistor 16 is set in a low resistance state. Therefore, a current does not easily flow in the path extending through the spin MOS transistor 12, but a current easily flows in the path extending through the spin MOS transistor 16.

In FIG. 2, the voltage Vsp to be supplied to the node 31 is set at a voltage that is substantially equal to the power voltage Vdd. At the time of a rise, the voltage Vg to be supplied to the node 32 gradually drops from the power voltage Vdd, and finally stays at substantially a constant value (a reference voltage GND). The voltage drop is preferably performed at a lower speed than $3 \times 10^9$ V/s. The time required for the voltage Vg of the node 32 to drop to the substantially constant value since the start of an operation is represented by τ2. While the supplied voltage Vg is lowering, the voltage difference between the voltages V1 and V2 of the nodes 33 and 34 gradually becomes larger. The time is represented by τ1, when the voltage difference between the voltages V1 and V2 starts becoming larger since the start of the operation.

If the state of the information stored in the memory unit 10 is checked at time τ2 or later, the voltage V1 of the node 33 is at the H-level (the high voltage level), and the voltage V2 of the node 34 is at the L-level (the low voltage level). When the power supply is cut off and is again activated, the state of the information stored in the memory unit 10 does not change.

Unlike the conditions in the above description, the spin MOS transistor 12 shown in FIG. 1 may be set in a low resistance state, and the spin MOS transistor 16 may be set in a high resistance state. When the spin MOS transistors 12 and 16 are operated in the same manner as described above, and the state of the information stored in the memory unit 10 is checked at time τ2 or later, the voltage V1 of the node 33 is at the L-level, and the voltage V2 of the node 34 is at the H-level. When the power supply is cut off and is again activated, the state of the information stored in the memory unit 10 does not change.

As described above, the memory cell of this embodiment can have binary memory states, depending on the resistance states of the spin MOS transistors 12 and 16. Therefore, the memory cell of this embodiment functions as a binary nonvolatile memory cell.

Figure 3:
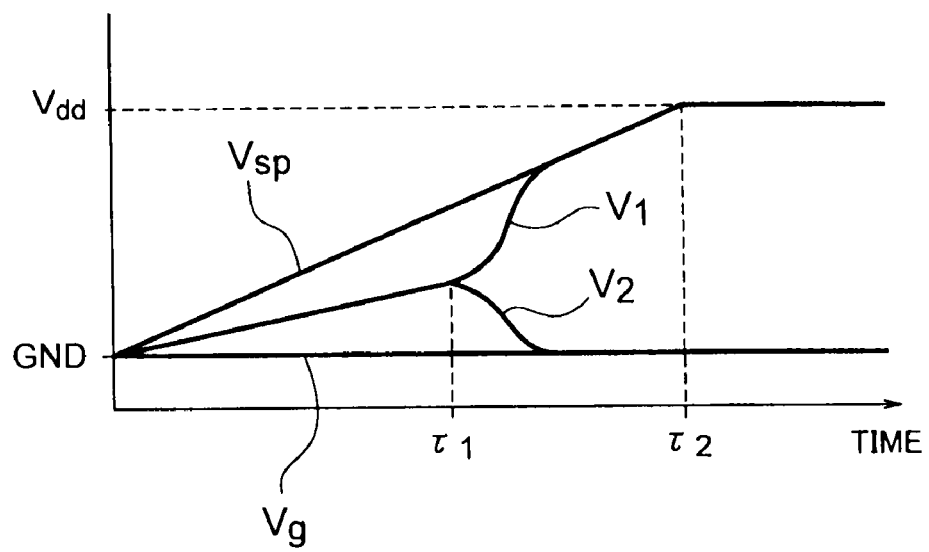
FIG. 3 is a timing chart showing the first method for determining the state of the information stored in the memory cell.

In the above description, to check the state of the information stored in the memory unit 10, the voltage Vsp of the node 31 is fixed at the power voltage Vdd, and the voltage Vg of the node 32 lowers from the power voltage Vdd to the reference voltage GND. However, as shown in FIG. 3, the voltage Vg of the node 32 may be fixed at the reference voltage GND, and the voltage Vsp of the node 31 may be increased from the reference voltage GND to the power voltage Vdd. In this case, the voltage rise is also preferably performed at a lower speed than $3 \times 10^9$ V/s.

Figure 4:
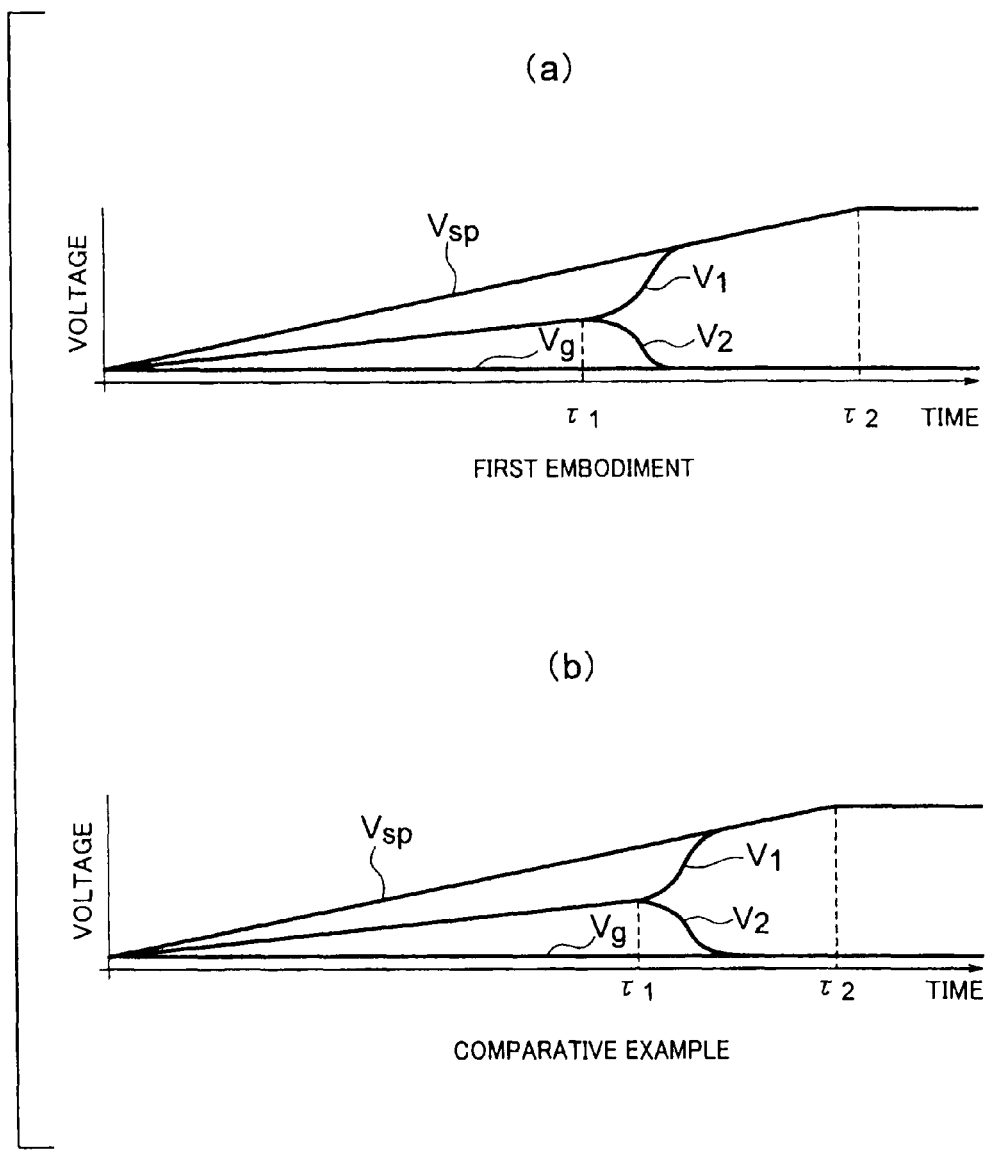
FIG. 4(a) is a diagram showing the results of simulations of power supply activations in the first embodiment.
FIG. 4(b) is a diagram showing the results of simulations of power supply activations in a comparative example.
Figure 5:
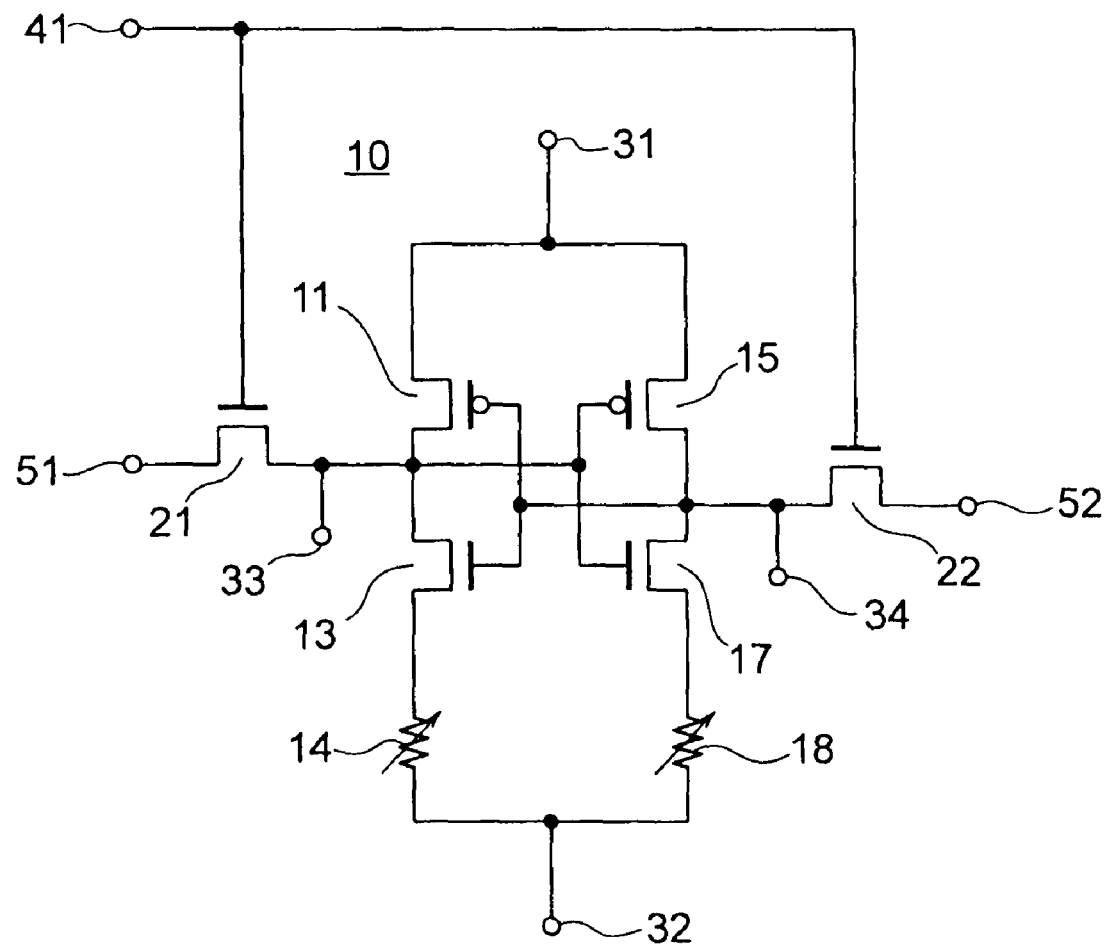
FIG. 5 is a circuit diagram showing a memory cell of a nonvolatile memory circuit according to the comparative example of the first embodiment.

FIGS. 4(a) and 4(b) show the results of simulations of power supply activations in the memory cell according to this embodiment and in a memory cell according to a comparative example. As shown in FIG. 5, the memory cell of this comparative example differs from the memory cell 1 of this embodiment in that the n-channel spin MOS transistors 12 and 16 are replaced with conventional n-channel MOS transistors 13 and 17, a MTJ device 14 is formed between the MOS transistor 13 and the node 32, and a MTJ device 18 is formed between the MOS transistor 17 and the node 32. The MOS transistors 13 and 17 have substantially the same electrical characteristics, and the MTJ devices 14 and 18 have substantially the same electrical characteristics. As can be seen from FIGS. 4(a) and 4(b), the time τ1 at which the voltage difference starts becoming larger is earlier in this embodiment than in the comparative example. Therefore, in this embodiment, the state of the information stored in the memory unit 10 is stabilized in an early stage, and a nonvolatile memory circuit that is stable despite variations in device characteristics and electrical noise is realized.

In this embodiment, to determine the resistance states of the spin MOS transistors 12 and 16 by spin torque transfer switching, a current that is equal to or higher than the current reversing the magnetization of a free layer (a magnetization switching current) flows in the spin MOS transistors 12 and 16. The direction of the magnetization switching current to generate a low resistance state is the opposite of the direction of the magnetization switching current to generate a high resistance state. Therefore, it is necessary to supply the current of both two directions to the spin MOS transistors 12 and 16. In a conventional MOS transistor, there is only one direction in which current flow. In the nonvolatile memory circuit of this embodiment, on the other hand, current of the two directions can flow in the spin MOS transistors 12 and 16.

Figure 6:
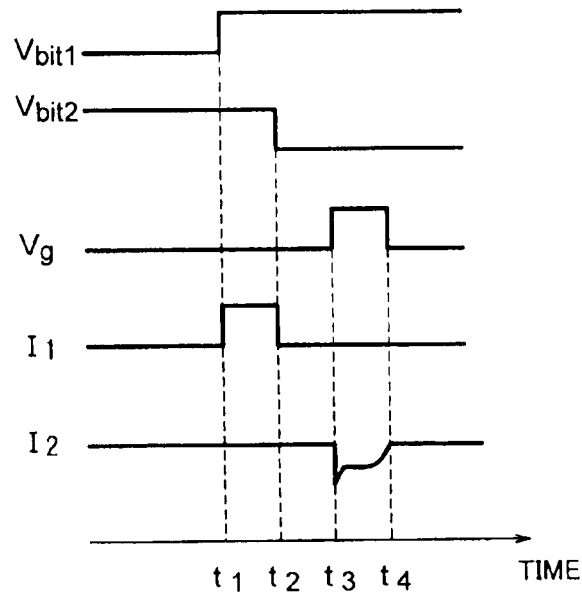
FIG. 6 is a timing chart for explaining a first specific example of a write method according to the first embodiment.

Referring now to FIG. 6, a writing method in the memory cell 1 of this embodiment is described.

FIG. 6 shows a waveform chart for explaining spin torque transfer switching in the spin MOS transistor 12 and the spin MOS transistor 16. In FIG. 6, Vbit1 represents the voltage of the node 51 shown in FIG. 2, Vbit2 represents the voltage of the node 52, Vg represents the voltage of the node 32, I1 represents the current flowing in the spin MOS transistor 12, and I2 represents the current flowing in the spin MOS transistor 16. The current I1 and the current I2 have positive directions of current flows from the spin MOS transistors to the node 32. In FIG. 6, the horizontal axis indicates time, and the vertical axis indicates each voltage.

The power voltage Vdd is applied to the node 41. The voltage Vbit1 of the node 51 and the voltage Vg of the node 32 are first set at the reference voltage GND, and the voltage Vbit2 of the node 52 is set at the power voltage Vdd. As a result, the voltage V2 of the node 34 is stabilized at the power voltage Vdd, and the voltage V1 of the node 33 is stabilized at the reference voltage GND.

Figure 7:
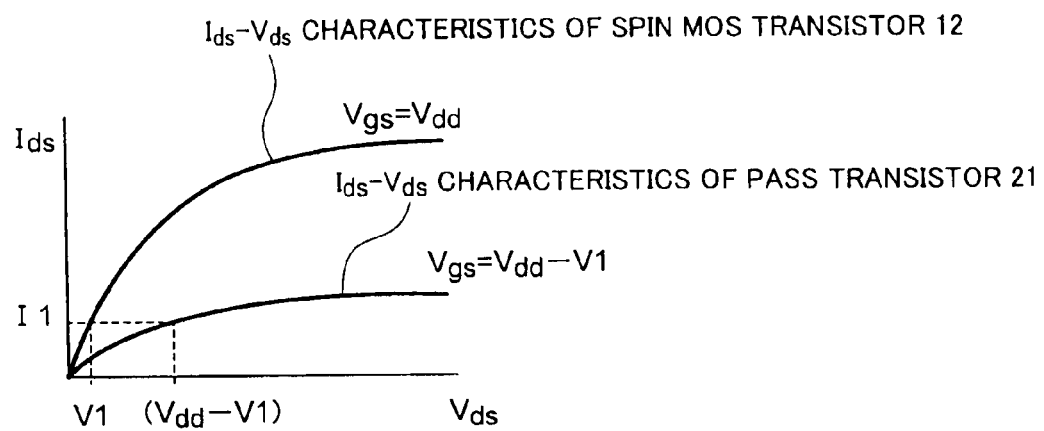
FIG. 7 is a characteristic chart for explaining the voltages at the points of connections with a pass transistor and a spin MOS transistor.

After that, as shown in FIG. 6, the voltage Vbit1 of the node 51 is set at the power voltage Vdd (time t1). The current I1 then flows from the node 51 into the node 32 through the pass transistor 21 and the spin MOS transistor 12, and the power voltage Vdd is applied in series to the pass transistor 21 and the spin MOS transistor 12. The voltage V1 of the node 33 is determined by the Ids-Vds characteristics of the pass transistor 21 and the spin MOS transistor 12, as shown in FIG. 7. Therefore, the voltage V1 of the node 33 becomes lower than the threshold voltage Vth of the spin MOS transistor 16. Here, Ids represents the current between the source and drain of a MOS transistor, and Vds represents the voltage between the source and drain of a MOS transistor. Since the voltage V1 is lower than the threshold voltage Vth of the spin MOS transistor 16, and the node 33 is connected to the gate of the spin MOS transistor 16, the spin MOS transistor 16 is put into an OFF state, and the voltage V2 of the node 34 is maintained at a high voltage that is close to the power voltage Vdd. Since the voltage V2 to be applied to the gate of the p-channel MOS transistor 11 is a high voltage that is close to the power voltage Vdd, only a very little current flows in the p-channel MOS transistor 15.

Next, the voltage Vbit2 of the node 52 is switched to the reference voltage GND (time t2 in FIG. 6). As a result, current does not flow into the spin MOS transistor 12. After that, the voltage Vg of the node 32 is switched to the power voltage Vdd (time t3 in FIG. 6). The negative current I2 then flows from the node 32 into the node 52 through the spin MOS transistor 16 and the pass transistor 22. After that, the voltage Vg of the node 32 is switched to the reference voltage GND (time t4 in FIG. 6). Then, current does not flow into the spin MOS transistor 16.

Since the positive current I1 can be caused to flow into the spin MOS transistor 12, and the negative current I2 can be caused to flow into the spin MOS transistor 16 by the above described method, the resistance states of the spin MOS transistors 12 and 16 can be determined by spin torque transfer switching, or writing can be performed. If the voltages to be applied to the voltage Vbit1 and the voltage Vbit2 are switched, a negative current I1 can be caused to flow into the spin MOS transistor 12, and a positive current I2 can be caused to flow into the spin MOS transistor 16.

As described above, magnetization switching current of the opposite directions can be caused to flow into the n-channel spin MOS transistor 12 and the n-channel spin MOS transistor 16 in this embodiment. Therefore, the resistance states of the spin MOS transistor 12 and the spin MOS transistor 16 can be made complementary to each other.

In this embodiment, when a spin injection current starts to flow in the n-channel spin MOS transistor 16, a negative current of a large absolute value transiently flows, as shown in FIG. 6. In spin torque transfer switching, flowing a spin injection current from a pinned layer to a free layer requires the higher magnetization switching current. Therefore, it is more preferable to form a spin MOS transistor in such a manner that the ferromagnetic layer of the source electrode serves as a pinned layer, and the ferromagnetic layer of the drain electrode serves as a free layer.

According to the above described write method, a spin injection current is caused to flow, with the voltages to be applied to the respective nodes being the power voltage Vdd and the reference voltage GND. By this method, it is not necessary to prepare a separate power supply for voltages to cause high current. Therefore, this method can achieve a small power supply circuit and is suitable for high integration.

According to the above described write method, the power voltage Vdd is used. However, higher voltages than the power voltage Vdd may be applied to the nodes 51, 52, and 32. Also, according to the above described write method, the reference voltage GND is used. However, lower voltages than the reference voltage GND may be applied to the nodes 51, 52, and 32.

Figure 8:
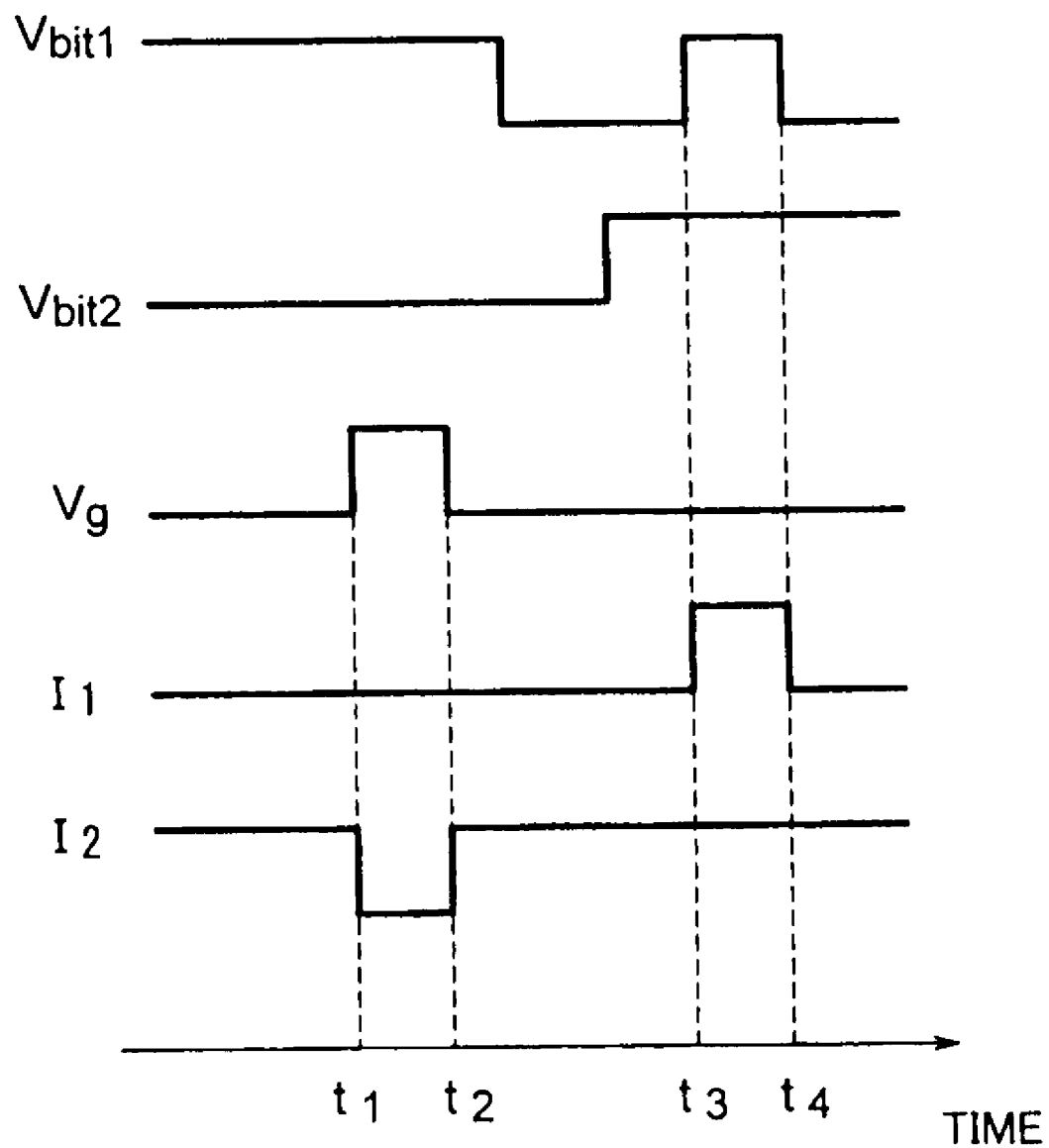
FIG. 8 is a timing chart for explaining a second specific example of a write method according to the first embodiment.

According to the above described write method, a positive current is first caused to flow into the spin MOS transistor 12. However, a negative current may be first caused to flow as shown in FIG. 8. More specifically, the power voltage Vdd is applied to the node 41, so that the voltage Vbit1 of the node 51 is set at the power voltage Vdd, and the voltage Vbit2 of the node 52 is set at the reference voltage GND. When the voltage Vg of the node 32 is switched to the power voltage Vdd (time t1 in FIG. 8) in this situation, a negative current I2 flows from the node 32 into the node 52 through the spin MOS transistor 16 and the pass transistor 22. When the voltage Vg of the node 32 is switched to the reference voltage GND (time t2 in FIG. 8), current does not flow into the spin MOS transistor 16. After the voltage Vbit1 of the node 51 is switched to the reference voltage GND, and the voltage Vbit2 of the node 52 is switched to the power voltage Vdd, the voltage Vbit1 of the node 51 is switched to the power voltage Vdd (time t3 in FIG. 8). A positive current I1 then flows into the node 32 through the node 51, the pass transistor 21, and the spin MOS transistor 12. This current I1 stops flowing when the voltage Vbit1 of the node 51 is switched to the reference voltage GND.

As described above, according to the first embodiment, spin MOS transistors are used as nonvolatile memory devices. Therefore, unlike a case where MTJ devices are used, this embodiment can prevent a decrease in operation margin, and prevent false operations due to variations in resistance value among MOS transistors.

Also, according to the first embodiment, spin MOS transistors are manufactured by the same process, so that variations in electrical characteristics become very small. Therefore, a high yield nonvolatile memory circuit can be obtained.

Second Embodiment

Figure 9:
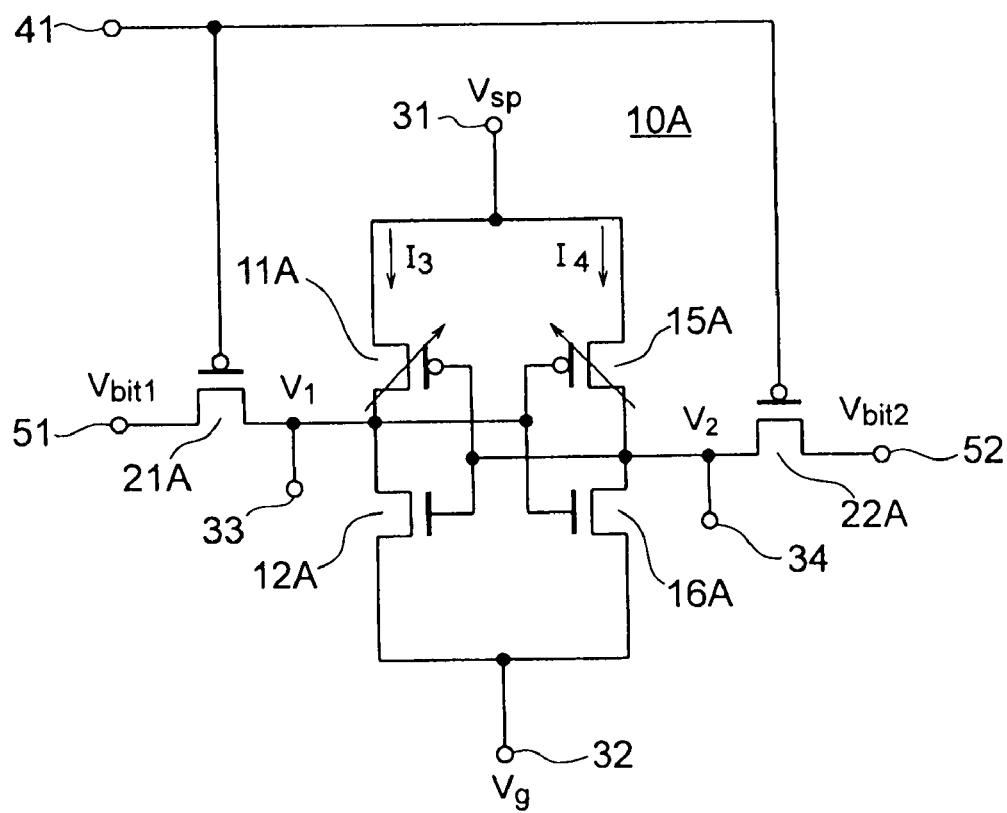
FIG. 9 is a circuit diagram showing a memory cell of a nonvolatile memory circuit according to a second embodiment.

FIG. 9 shows a nonvolatile memory circuit according to a second embodiment. The nonvolatile memory circuit of the second embodiment includes a memory cell 1A. This memory cell 1A is the same as the memory cell 1 of the first embodiment shown in FIG. 1, except that the memory unit 10 is replaced with a memory unit 10A, and the pass transistors 21 and 22 formed with n-channel MOS transistors are replaced with pass transistors 21A and 22A formed with p-channel MOS transistors. The memory unit 10A is the same as the memory unit 10 of the first embodiment, except that the p-channel MOS transistors 11 and 15 are replaced with p-channel spin MOS transistors 11A and 15A, and the n-channel spin MOS transistors 12 and 16 are replaced with n-channel MOS transistors 12A and 16A. The p-channel spin MOS transistors 11A and 15A have substantially the same electrical characteristics, and the n-channel MOS transistors 12A and 16A have substantially the same electrical characteristics. Also, the pass transistors 21A and 22A have substantially the same electrical characteristics.

In the second embodiment, one of the spin MOS transistor 11A and the spin MOS transistor 15A is set in a low resistance state, and the other one is set in a high resistance state, as in the first embodiment. For example, when the power supply is activated, the spin MOS transistor 11A is set in a low resistance state, and the spin MOS transistor 15A is set in a high resistance state. A voltage is then applied in the same manner as in the case illustrated in FIG. 2. More specifically, the voltages Vsp and Vg of the nodes 31 and 32 are set at the power voltage Vdd, and the voltage Vsp of the node 31 is gradually lowered to the reference voltage GND. If the state of the information stored in the memory unit 10A is checked at time τ2 or later, the voltage V1 of the node 33 is at the H-level, and the voltage V2 of the node 34 is at the L-level. When the power supply is cut off and is again activated, the state of the information stored in the memory unit 10A does not change.

In a case where the spin MOS transistor 11A is set in a high resistance state, the spin MOS transistor 15A is set in a low resistance state, an operation is performed in the same manner as described above, and a check is made at time τ2 or later, the voltage V1 of the node 33 is at the L-level, and the voltage V2 of the node 34 is at the H-level. When the power supply is cut off and is again activated, the state of the information stored in the memory unit 10A does not change.

As described above, the memory cell 1A of the second embodiment can have binary memory states, depending on the resistance states of the spin MOS transistors 11A and 15A. Therefore, the memory cell 1A of the second embodiment functions as a binary nonvolatile memory cell.

In the above description, to check the state of the information stored in the memory unit 10A, the voltage Vsp of the node 31 is fixed at the power voltage Vdd, and the voltage Vg of the node 32 is lowered from the power voltage Vdd to the reference voltage GND. However, as shown in FIG. 3, the voltage Vg of the node 32 may be fixed at the reference voltage GND, and the voltage Vsp of the node 31 may be increased from the reference voltage GND to the power voltage Vdd.

Like the first embodiment, the second embodiment uses spin MOS transistors that cause changes in resistance state even if the supplied voltage is low. Therefore, the time τ1 at which the voltage difference starts becoming larger can be made earlier, and the state of the information stored in the memory unit 10A is stabilized in an early stage. Thus, a nonvolatile memory circuit that is stable despite electrical noise is realized.

Figure 10:
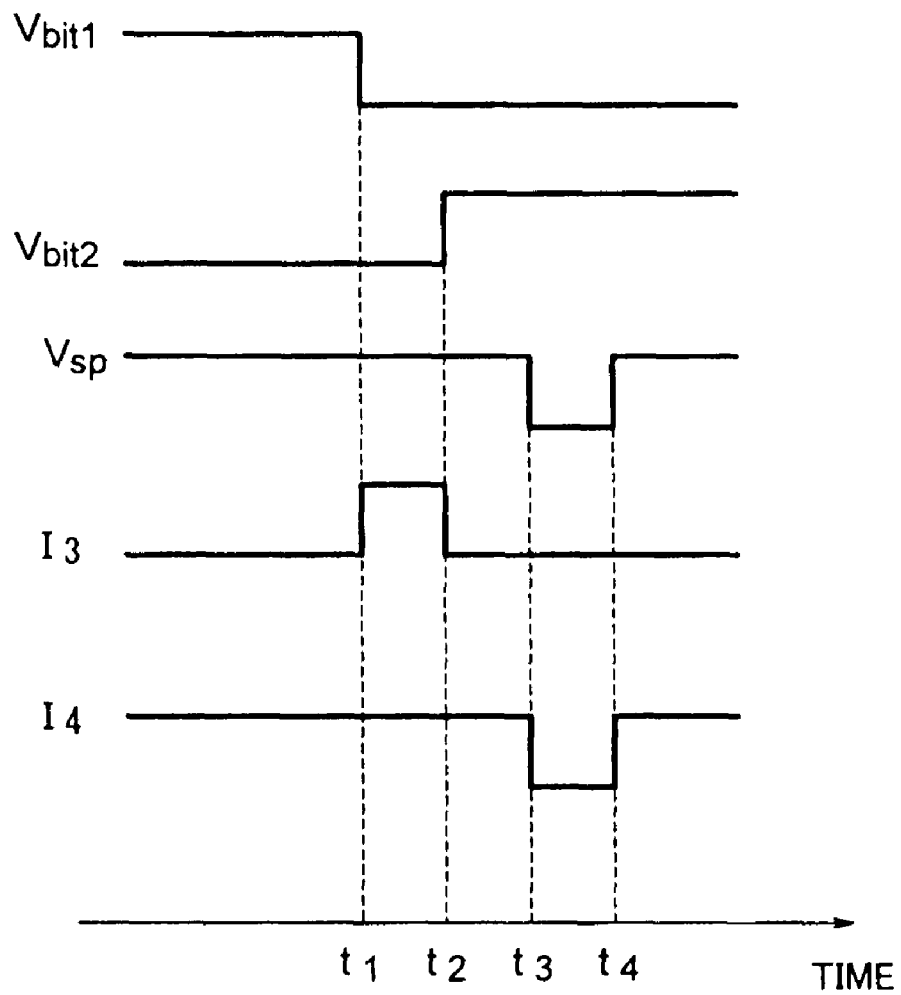
FIG. 10 is a timing chart for explaining a write method according to the second embodiment.

Referring now to FIG. 10, a method of performing writing in the memory cell 1A of the second embodiment is described. FIG. 10 is a timing chart for explaining the method of performing writing in the memory cell 1A of the second embodiment.

In FIG. 10, I3 represents the current flowing in the spin MOS transistor 11A, and I4 represents the current flowing in the spin MOS transistor 15A. The other signs are the same as those of the first embodiment. The current I3 and the current I4 have positive directions of current flows from the node 31 to the spin MOS transistors 11A and 15A.

First, the reference voltage GND is applied to the node 41, so that the voltage Vsp of the node 31 and the voltage Vbit1 of the node 51 are set at the power voltage Vdd, and the voltage Vbit2 of the node 52 is set at the reference voltage GND. As a result, the voltage V1 of the node 33 is stabilized at the power voltage Vdd, and the voltage V2 of the node 34 is stabilized at the reference voltage GND.

After that, as shown in FIG. 10, the voltage Vbit1 of the node 51 is set at the reference voltage GND (time t1). The current I3 then flows from the node 31 into the node 51 through the spin MOS transistor 11A and the pass transistor 21A, and the power voltage Vdd is applied in series to the spin MOS transistor 11A and the pass transistor 21A. As in the first embodiment, the voltage V2 of the node 34 is lower than the threshold voltage Vth of the spin MOS transistor 11A, and the node 34 is connected to the gate of the spin MOS transistor 11A. Therefore, the spin MOS transistor 11A is put into an ON state, and the voltage V2 of the node 34 is maintained at a low voltage that is close to the reference voltage GND. Since the voltage V2 to be applied to the gate of the n-channel MOS transistor 12A is a low voltage close to the reference voltage GND at this point, only a very little current flow in the n-channel MOS transistor 12A.

The voltage Vbit2 of the node 52 is then switched to the power voltage Vdd (time t2 in FIG. 10). As a result, current does not flow into the spin MOS transistor 11A. After that, the voltage Vsp of the node 31 is switched to the reference voltage GND (time t3 in FIG. 10). The negative current I4 then flows from the node 52 into the node 31 through the pass transistor 22A and the spin MOS transistor 15A. After that, the voltage Vsp of the node 31 is switched to the power voltage Vdd (time t4 in FIG. 10). The, current does not flow into the spin MOS transistor 15A.

Since the positive current I3 can be caused to flow into the spin MOS transistor 11A, and the negative current I4 can be caused to flow into the spin MOS transistor 15A by the above described write method, the resistance states of the spin MOS transistors 11A and 15A can be determined by spin torque transfer switching, or writing can be performed. If the voltage Vbit1 of the node 51 and the voltage Vbit2 of the node 52 in FIG. 10 are switched, a negative current can be caused to flow into the spin MOS transistor 11A, and a positive current can be caused to flow into the spin MOS transistor 15A.

As described above, spin torque transfer switching current of the opposite directions can be caused to flow into the spin MOS transistor 11A and the spin MOS transistor 15A in the second embodiment. Therefore, the resistance states of the spin MOS transistor 11A and the spin MOS transistor 15A can be made complementary to each other.

According to the above described write method, the power voltage Vdd is used. However, higher voltages than the power voltage Vdd may be applied to the nodes 51, 52, and 31. Also, according to the above described write method, the reference voltage GND is used. However, lower voltages than the reference voltage GND may be applied to the nodes 51, 52, and 31.

According to the above described write method, a positive current is first caused to flow into the spin MOS transistor 11A. However, a negative current may be first caused to flow.

As described above, according to the second embodiment, spin MOS transistors are used as nonvolatile memory devices. Therefore, unlike a case where MTJ devices are used, this embodiment can prevent a decrease in operation margin, and prevent false operations due to variations in resistance value among MOS transistors.

Also, according to the second embodiment, spin MOS transistors are manufactured by the same process, so that variations in electrical characteristics become very small. Therefore, a high yield nonvolatile memory circuit can be obtained.

Third Embodiment

Figure 11:
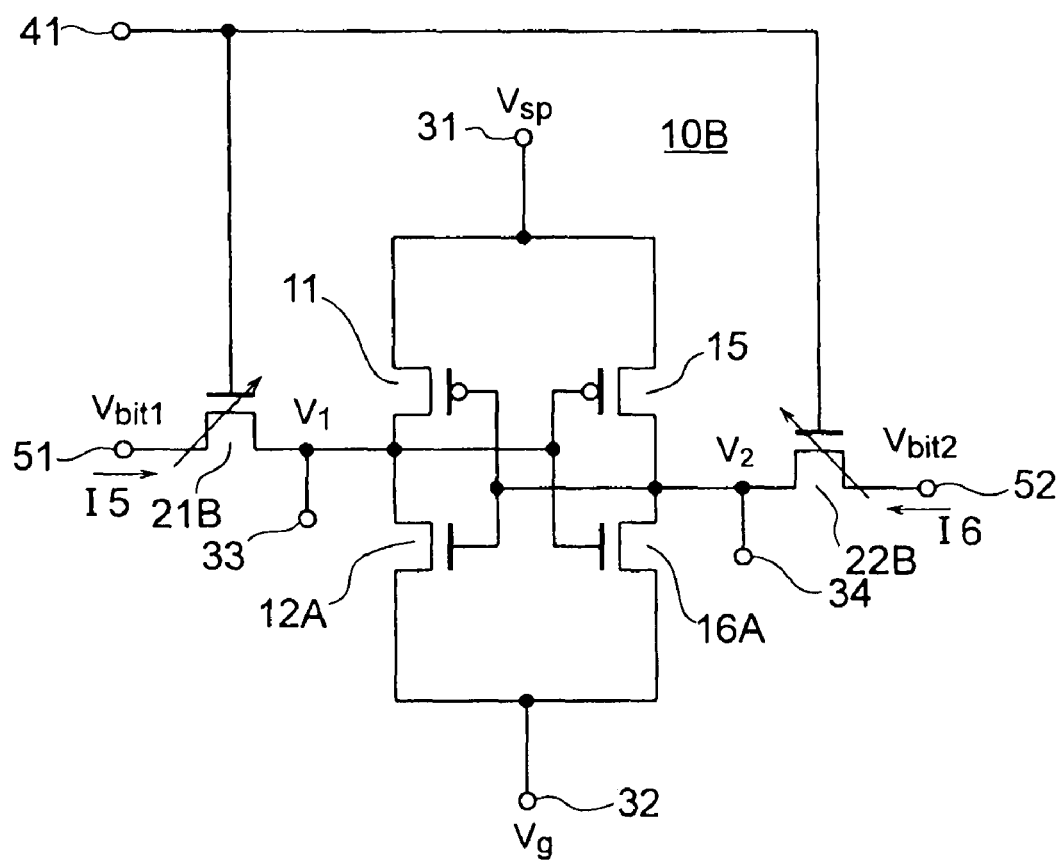
FIG. 11 is a circuit diagram showing a memory cell of a nonvolatile memory circuit according to a third embodiment.

FIG. 11 shows a nonvolatile memory circuit according to a third embodiment. The nonvolatile memory circuit of the third embodiment includes a memory cell 1B. This memory cell 1B is the same as the nonvolatile memory cell 1 of the first embodiment shown in FIG. 1, except that the memory unit 10 is replaced with a memory unit 10B, and the pass transistors 21 and 22 formed with n-channel MOS transistors are replaced with pass transistors 21B and 22B formed with n-channel spin MOS transistors. The memory unit 10B is the same as the memory unit 10 of the first embodiment, except that the n-channel spin MOS transistors 12 and 16 are replaced with n-channel MOS transistors 12A and 16A. The n-channel spin MOS transistors 21B and 22B have substantially the same electrical characteristics, and the n-channel MOS transistors 12A and 16A have substantially the same electrical characteristics.

In the third embodiment, one of the spin MOS transistor 21B and the spin MOS transistor 22B is also set in a low resistance state, and the other one is set in a high resistance state.

Next, a power supply activating operation in the third embodiment is described. First, the voltage of the node 41 is set at the power voltage Vdd, and the voltage Vbit1 of the node 51 and the voltage Vbit2 of the node 52 are set at the reference voltage GND.

As in the case illustrated in FIG. 3, the voltage Vg of the node 32 is fixed at the reference voltage GND, and the voltage Vsp of the node 31 is increased from the reference voltage GND to the power voltage Vdd. In a case where the spin MOS transistor 21B is set in a high resistance state and the spin MOS transistor 22B is set in a low resistance state, the voltage difference between the voltage V1 of the node 33 and the voltage V2 of the node 34 gradually becomes larger, as in the case of the first embodiment illustrated in FIG. 3. If a check is made at time τ2 or later, the voltage V1 of the node 33 is at the H-level, and the voltage V2 of the node 34 is at the L-level. When the power supply is cut off and is again activated, this memory state does not change.

In a case where the spin MOS transistor 21B is set in a low resistance state, the spin MOS transistor 22B is set in a high resistance state, an operation is performed in the same manner as described above, and a check is made at time τ2 or later, the voltage V1 of the node 33 is at the L-level, and the voltage V2 of the node 34 is at the H-level. When the power supply is cut off and is again activated, the memory state does not change.

As described above, the nonvolatile memory circuit of the third embodiment can have binary memory states, depending on the resistance states of the spin MOS transistors 21B and 22B. Therefore, the nonvolatile memory circuit of the third embodiment functions as a binary nonvolatile memory circuit. In other words, as well as the memory unit 10B, the pass transistors 21B and 22B formed with spin MOS transistors also function as memories in the third embodiment.

Like the first embodiment, the third embodiment uses spin MOS transistors that cause changes in resistance state even if the supplied voltage is low. Therefore, the time τ1 at which the voltage difference starts becoming larger can be made earlier, and the state of the information stored in the memory circuit is stabilized in an early stage. Thus, a nonvolatile memory circuit that is stable despite electrical noise is realized.

Figure 12:
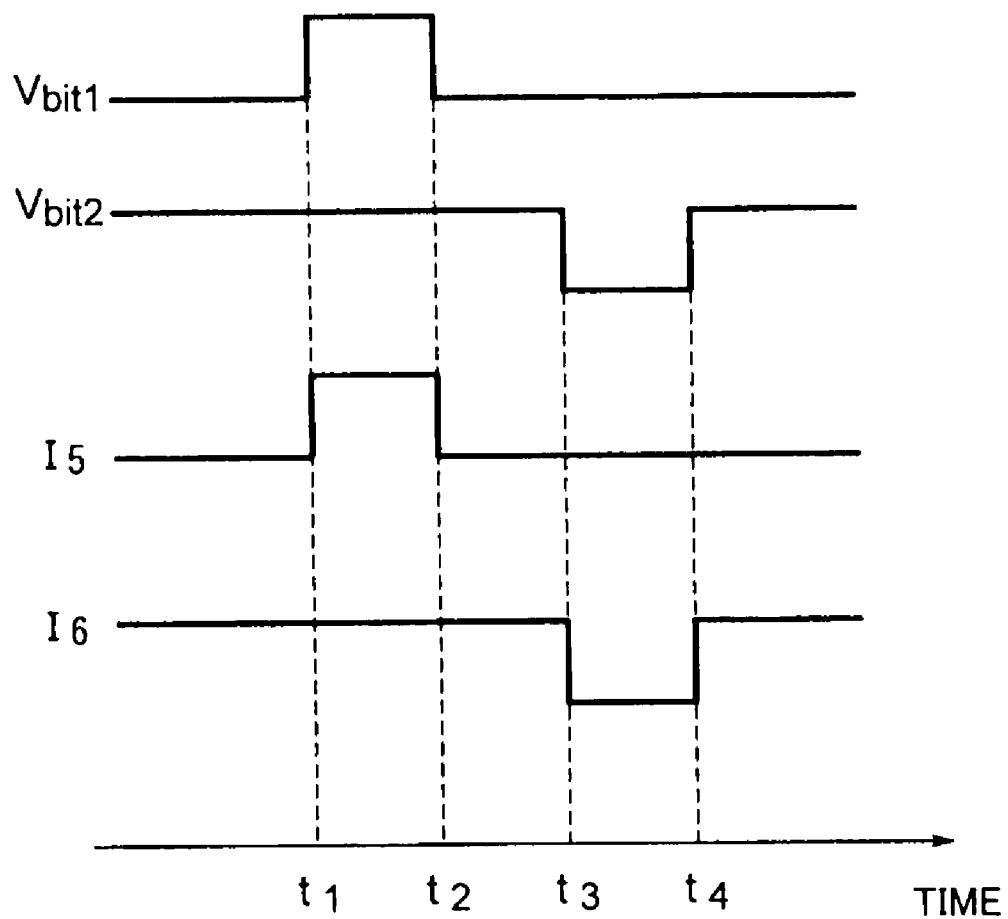
FIG. 12 is a timing chart for explaining a write method according to the third embodiment.

Referring now to FIG. 12, a method of performing writing in the memory cell 1B of the third embodiment is described. FIG. 12 is a timing chart for explaining the method of performing writing in the memory cell 1B of the third embodiment.

In FIG. 11, I5 represents the current flowing in the spin MOS transistor 21B, and I6 represents the current flowing in the spin MOS transistor 22B. The other signs are the same as those of the first embodiment. The current I5 has a positive direction of a current flow from the node 51 to the node 33 through the spin MOS transistor 21B, and the current I6 has a positive direction of a current flow from the node 52 to the node 34 through the spin MOS transistors 22B.

First, the voltage of the node 41 is set at the power voltage Vdd, so that the voltage Vsp of the node 31 is set at the power voltage Vdd, and the voltage Vg of the node 32 is set at the reference voltage GND. After that, the voltage Vbit1 of the node 51 is set at the reference voltage GND, and the voltage Vbit2 of the node 52 is set at the power voltage Vdd (see FIG. 12). In this situation, the spin MOS transistors 21B and 22B are in an ON state. Also, since the node 33 is at a low voltage while the node 34 is at a high voltage, the p-channel MOS transistor 11 is in an OFF state, the n-channel MOS transistor 12A is in an ON state, the p-channel MOS transistor 15 is in an ON state, and the n-channel MOS transistor 16A is in an OFF state. Therefore, current does not flow into the spin MOS transistors 21B and 22B. When the voltage Vbit1 of the node 51 is increased to the power voltage Vdd, the positive current I5 flows from the node 51 into the node 32 through the spin MOS transistor 21B and the n-channel MOS transistor 12A (time t1 in FIG. 12). At this point, the voltage V1 of the node 33 becomes lower than the threshold voltage of the n-channel MOS transistor 16A, the n-channel MOS transistor 16A maintains an OFF state, and current does not flow into the MOS transistor 16A and the spin MOS transistor 22B, as described in the first embodiment. In the third embodiment, the Ids-Vds characteristics of a MOS transistor and a spin MOS transistor shown in FIG. 7 are switched. More specifically, the upper graph in FIG. 7 indicates the characteristics of the MOS transistor 12A, and the lower graph indicates the characteristics of the spin MOS transistor 21B. After that, the voltage Vbit1 of the node 51 is lowered to the reference voltage GND, and current does not flow into the spin MOS transistor 21B (time t2 in FIG. 12). At this point, the p-channel MOS transistor 11 and the n-channel MOS transistor 16A each maintain an OFF state, and the p-channel MOS transistor 15 and the n-channel MOS transistor 12A each maintain an ON state. When the voltage Vbit2 of the node 52 is lowered to the reference voltage GND in this situation, the negative current I6 flows from the node 31 into the node 52 through the p-channel MOS transistor 15 and the spin MOS transistor 22B (time t3 in FIG. 12). At this point, the voltage V1 of the node 33 becomes a voltage close to the reference voltage GND, the n-channel MOS transistor 16A is in an OFF state, and current does not flow into the n-channel MOS transistor 16A. Also, since the p-channel MOS transistor 15 is in an ON state, the voltage V2 of the node 34 becomes a voltage close to the power voltage Vdd, the p-channel MOS transistor 11 is put into an OFF state, and current does not flow into the n-channel MOS transistor 12A. After that, the voltage Vbit2 of the node 52 is increased to the power voltage Vdd, and current does not flow into the spin MOS transistor 22B (time t4 in FIG. 12).

Since the positive current I5 can be caused to flow into the spin MOS transistor 21B, and the negative current I6 can be caused to flow into the spin MOS transistor 22B by the above described write method, writing can be performed. If the voltage Vbit1 of the node 51 and the voltage Vbit2 of the node 52 in FIG. 12 are switched, a negative current can be caused to flow into the spin MOS transistor 21B, and a positive current can be caused to flow into the spin MOS transistor 22B.

As described above, spin torque transfer switching current of the opposite directions can be caused to flow into the spin MOS transistor 21B and the spin MOS transistor 22B in the third embodiment. Therefore, the resistance states of the spin MOS transistor 21B and the spin MOS transistor 22B can be made complementary to each other.

According to the write method of the third embodiment, the power voltage Vdd is applied to the node 51, the node 52, and the node 31. However, higher voltages than the power voltage Vdd may be applied to those nodes. Also, according to the write method of the third embodiment, the reference voltage GND is applied to the node 51, the node 52, and the node 32. However, lower voltages than the reference voltage GND may be applied to those nodes.

According to the above described write method, a positive current is first caused to flow into the spin MOS transistor 21B. However, a negative current may be first caused to flow into the spin MOS transistor 22B.

As described above, according to the third embodiment, spin MOS transistors are used as nonvolatile memory devices. Therefore, unlike a case where MTJ devices are used, this embodiment can prevent a decrease in operation margin, and prevent false operations due to variations in resistance value among MOS transistors.

Also, according to the third embodiment, spin MOS transistors are located outside an inverter loop. Therefore, the cause of a decrease in memory operation margin becomes insignificant, and a high operation margin can be readily achieved.

Also, according to the third embodiment, spin MOS transistors 21B and 22B are manufactured by the same process, so that variations in electrical characteristics become very small. Therefore, a high yield nonvolatile memory circuit can be obtained.

Fourth Embodiment

Figure 13:
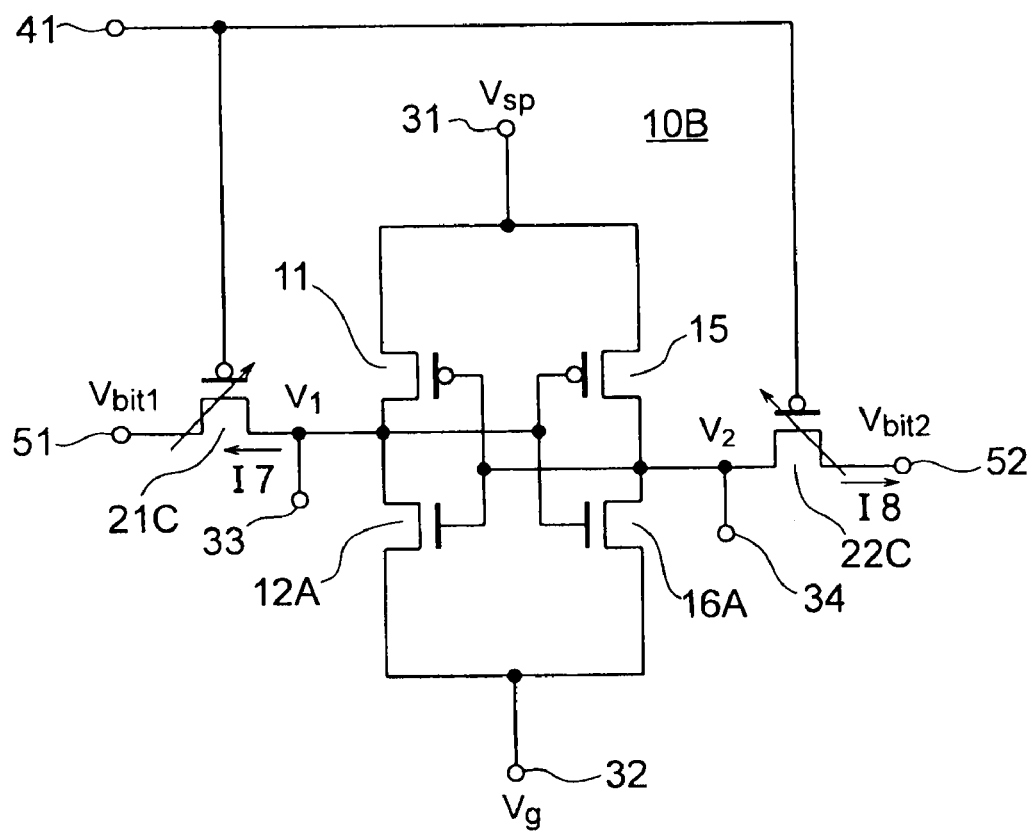
FIG. 13 is a circuit diagram showing a memory cell of a nonvolatile memory circuit according to a fourth embodiment.

FIG. 13 shows a nonvolatile memory circuit according to a fourth embodiment. The nonvolatile memory circuit of the fourth embodiment includes a memory cell 1C. This memory cell 1C is the same as the memory cell 1B of the third embodiment shown in FIG. 11, except that the pass transistors 21B and 22B formed with n-channel spin MOS transistors are replaced with pass transistors 21C and 22C formed with p-channel spin MOS transistors. The p-channel spin MOS transistors 21C and 22C have substantially the same electrical characteristics.

In the fourth embodiment, one of the spin MOS transistor 21C and the spin MOS transistor 22C is also set in a low resistance state, and the other one is set in a high resistance state.

Next, a power supply activating operation in the memory cell 1C of the fourth embodiment is described. First, the voltage of the node 41 is set at the reference voltage GND. The voltage Vbit1 of the node 51 and the voltage Vbit2 of the node 52 are then set at the power voltage Vdd. As shown in FIG. 2, the voltage Vsp of the node 31 is fixed at the power voltage Vdd, and the voltage Vg of the node 32 is lowered from the power voltage Vdd to the reference voltage GND.

In the fourth embodiment, where the spin MOS transistor 21C is set in a low resistance state and the spin MOS transistor 22C is set in a high resistance state, the voltage difference between the voltage V1 of the node 33 and the voltage V2 of the node 34 gradually becomes larger, as in the case illustrated in FIG. 2. If a check is made at time τ2 or later, the voltage V1 of the node 33 is at the H-level, and the voltage V2 of the node 34 is at the L-level. When the power supply is cut off and is again activated, this memory state does not change.

In the fourth embodiment, where the spin MOS transistor 21C is set in a high resistance state, the spin MOS transistor 22C is set in a low resistance state, an operation is performed in the same manner as in the case illustrated in FIG. 2, and a check is made at time τ2 or later, the voltage V1 of the node 33 is at the L-level, and the voltage V2 of the node 34 is at the H-level. When the power supply is cut off and is again activated, the memory state does not change.

As described above, the memory cell 1C of the fourth embodiment can have binary memory states, depending on the resistance states of the spin MOS transistors 21C and 22C. Therefore, the memory cell 1C of the fourth embodiment functions as a binary nonvolatile memory cell. In other words, as well as the memory unit 10B, the pass transistors 21C and 22C formed with spin MOS transistors also function as memories in the fourth embodiment.

Also, the fourth embodiment uses spin MOS transistors that cause changes in resistance state even if the supplied voltage is low. Therefore, the time τ1 at which the voltage difference starts becoming larger can be made earlier, and the memory state is stabilized in an early stage. Thus, a nonvolatile memory circuit that is stable despite electrical noise is realized.

Figure 14:
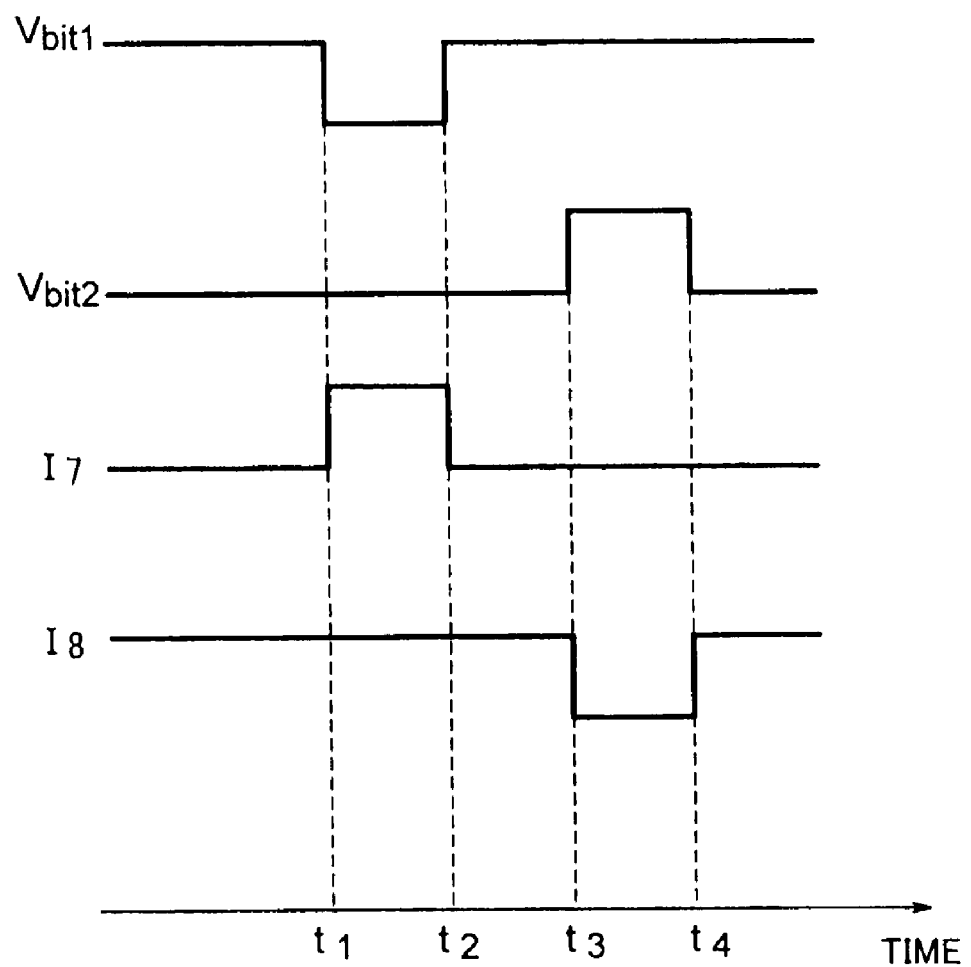
FIG. 14 is a timing chart for explaining a write method according to the fourth embodiment.

Referring now to FIG. 14, a method of performing writing in the memory cell 1C of the fourth embodiment is described. FIG. 14 is a timing chart for explaining the method of performing writing in the memory cell 1C of the fourth embodiment.

In FIG. 13, I7 represents the current flowing in the spin MOS transistor 21C, and I8 represents the current flowing in the spin MOS transistor 22C. The other signs are the same as those of the first embodiment. The current I7 has a positive direction of a current flow from the node 33 to the node 51 through the spin MOS transistor 21C, and the current I8 has a positive direction of a current flow from the node 34 to the node 52 through the spin MOS transistors 22C.

First, the voltage of the node 41 is set at the reference voltage GND, so that the voltage Vsp of the node 31 is set at the power voltage Vdd, and the voltage Vg of the node 32 is set at the reference voltage GND. After that, the voltage Vbit1 of the node 51 is set at the power voltage Vdd, and the voltage Vbit2 of the node 52 is set at the reference voltage GND (see FIG. 14). The voltage Vbit1 of the node 51 is then lowered to the reference voltage GND, and the positive current I7 flows from the node 31 into the node 51 through the p-channel MOS transistor 11 and the spin MOS transistor 21C (time t1 in FIG. 14). At this point, the voltage V2 of the node 34 is low, the MOS transistor 12A is in an OFF state, and current does not flow into the MOS transistor 12A. Also, since the voltage V1 of the node 33 becomes a high voltage that is close to the power voltage Vdd, the p-channel MOS transistor 15 is put into an OFF state, and only a very little current flow into the p-channel MOS transistor 15. After that, the voltage Vbit1 of the node 51 is increased to the power voltage Vdd, and then current does not flow into the spin MOS transistor 21C (time t2 in FIG. 14). The voltage Vbit2 of the node 52 is then increased to the power voltage Vdd, and the negative current I8 flows from the node 52 into the node 32 through the spin MOS transistor 22C and the n-channel MOS transistor 16A (time t3 in FIG. 14). At this point, the voltage V1 of the node 33 becomes a high voltage that is close to the power voltage Vdd, the MOS transistor 15 is put into an OFF state, and current does not flow into the MOS transistor 15. Also, since the voltage V2 of the node 34 becomes a lower voltage than the threshold voltage of the MOS transistor 12A, only a very little current flow into the n-channel MOS transistor 12A. The voltage Vbit2 of the node 52 is then lowered to the reference voltage GND, and current does not flow into the spin MOS transistor 22C (time t4 in FIG. 14).

As a high voltage and a low voltage are applied to the voltage Vbit1 of the node 51 and the voltage Vbit2 of the node 52 in the manner illustrated in FIG. 14, the positive current I7 can be caused to flow into the spin MOS transistor 21C, and the negative current I8 can be caused to flow into the spin MOS transistor 22C, and writing can be performed. If the voltage Vbit1 of the node 51 and the voltage Vbit2 of the node 52 in FIG. 14 are switched, a negative current can be caused to flow into the spin MOS transistor 21C, and a positive current can be caused to flow into the spin MOS transistor 22C.

According to the write method of the fourth embodiment, the power voltage Vdd is applied to the nodes 51 and 52, and the node 31. However, higher voltages than the power voltage Vdd may be applied to those nodes.

Also, according to the write method of the fourth embodiment, the reference voltage GND is applied to the nodes 51 and 52, and the node 32. However, lower voltages than the reference voltage GND may be applied to those nodes.

According to the above described write method, a positive current is first caused to flow into the spin MOS transistors 21C and 22C. However, a negative current may be first caused to flow.

Also, magnetization switching current of the opposite directions can be caused to flow into the spin MOS transistor 21C and the spin MOS transistor 22C in the fourth embodiment. Therefore, the resistance states of the spin MOS transistor 21C and the spin MOS transistor 22C can be made complementary to each other.

As described above, according to the fourth embodiment, spin MOS transistors are used as nonvolatile memory devices. Therefore, unlike a case where MTJ devices are used, this embodiment can prevent a decrease in operation margin, and prevent false operations due to variations in resistance value among MOS transistors.

Also, according to the fourth embodiment, spin MOS transistors 21C and 22C are located outside an inverter loop. Therefore, the cause of a decrease in memory operation margin becomes more insignificant, and a high operation margin can be readily achieved.

Also, according to the fourth embodiment, spin MOS transistors 21C and 22C are manufactured by the same process, so that variations in electrical characteristics become very small. Therefore, a high yield nonvolatile memory circuit can be obtained.

Fifth Embodiment

Figure 15:
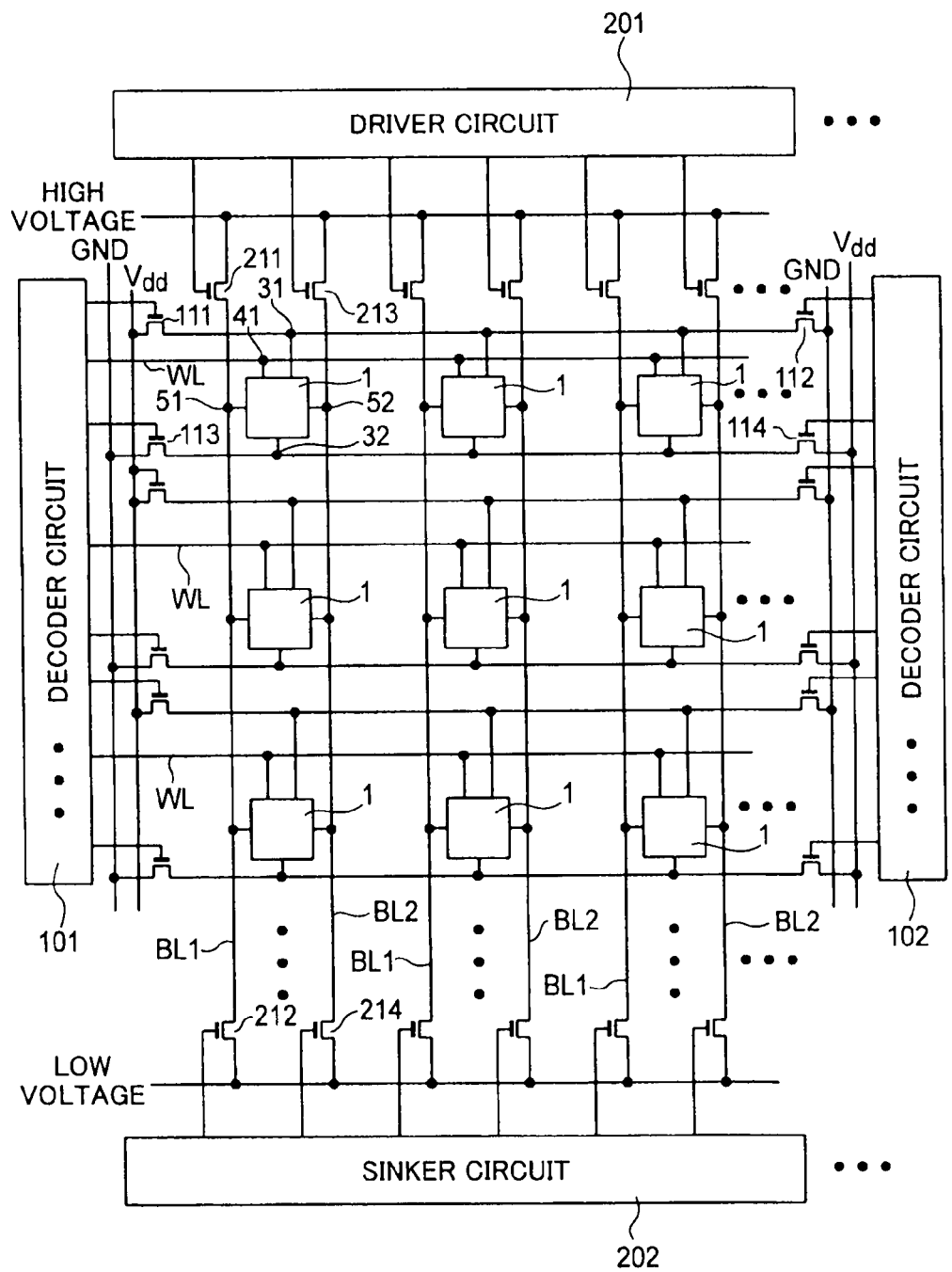
FIG. 15 is a circuit diagram showing a nonvolatile memory circuit according to a fifth embodiment.

FIG. 15 shows a nonvolatile memory circuit according to a fifth embodiment of the present invention. The nonvolatile memory circuit of the fifth embodiment includes memory cells 1 arranged in a matrix fashion, word lines WL, bit lines BL1 and BL2, decoder circuits 101 and 102, a driver circuit 201, and a sinker circuit 202. The memory cells 1 each have the same structure as a memory cell of a nonvolatile memory circuit according to one of the first through fourth embodiments. The word lines WL are formed for the respective rows, and are connected to the nodes 41 of the memory cells 1 of the corresponding rows and the decoder circuits 101 and 102. The bit lines BL1 and BL2 are formed for the respective columns, and are connected to the nodes 51 and 52 of the memory cells 1 of the corresponding columns.

The decoder circuits 101 and 102 select a row of the memory cells arranged in a matrix fashion by selecting a word lines WL. To perform writing and reading on the memory cells 1, two select transistors 111 and 113 are formed for each row in the decoder circuit 101, and two select transistors 112 and 114 are formed for each row in the decoder 102. Each select transistor 111 has a gate connected to the decoder circuit 101, has a drain connected to the power voltage Vdd, and has a source connected to the nodes 31 of the memory cells 1 of each corresponding row. Each select transistor 113 has a gate connected to the decoder circuit 101, has a source connected to the reference voltage GND, and has a drain connected to the nodes 32 of the memory cells 1 of each corresponding rows. Each select transistor 112 has a gate connected to the decoder circuit 102, has a source connected to the reference voltage GND, and has a drain connected to the nodes 31 of the memory cells 1 of each corresponding row. Each select transistor 114 has a gate connected to the decoder circuit 102, has a drain connected to the power voltage Vdd, and a source connected to the nodes 32 of the memory cells 1 of each corresponding row. In other words, the select transistors 111 and the select transistors 112 are selected by the decoder circuit 101 and the decoder circuit 102, respectively, and the select transistors 113 and the select transistors 114 are selected by the decoder circuit 101 and the decoder circuit 102, respectively.

The driver circuit 201 and the sinker circuit 202 select a column of the memory cells 1 arranged in a matrix fashion, and apply current to the bit lines BL1 and BL2 of the selected column. Therefore, two select transistors 211 and 213 are formed for each column in the driver circuit 201, and two select transistors 212 and 214 are formed for each column in the sinker circuit 202. Each select transistor 211 has a gate connected to the driver circuit 201, has a drain to which a high voltage (equal to or higher than the power voltage Vdd, for example) is applied, and has a source connected to the bit line BL1 of each corresponding column. Each select transistor 213 has a gate connected to the driver circuit 201, has a drain to which a high voltage is applied, and has a source connected to the bit line BL2 of each corresponding column. Also, each select transistor 212 has a gate connected to the sinker circuit 202, has a source to which a low voltage (equal to or lower than the reference voltage GND) is applied, and has a drain connected to the bit line BL1 of each corresponding column. Each select transistor 214 has a gate connected to the sinker circuit 202, has a source to which a low voltage is applied, and has a drain connected to the bit line BL2 of each corresponding column.

Those select transistors 111, 112, 113, 114, 211, 212, 213, and 214 occupy a very small area, compared with the large number of memory cells 1.

A high voltage and a low voltage can be applied in the example illustrated in FIG. 15. However, an even smaller area is required, if the power voltage Vdd is the high voltage, and the reference voltage GND is the low voltage.

According to the fifth embodiment, a nonvolatile memory circuit can be formed, without an increase in the number of transistors in each memory cell. Therefore, a highly-integrated nonvolatile memory circuit can be obtained.

As described so far, in the nonvolatile memory circuit of each of the first through fifth embodiments, spin MOS transistors are used in the memory cells. Since each spin MOS transistor has a nonvolatile memory function, the power supply can be switched off when neither a reading operation nor a writing operation is performed. Therefore, a low-power-consumption memory circuit can be realized. The memory is nonvolatile, and has the advantage that there is no need to perform writing on the memory cells every time the power supply is activated. Since the memory is a nonvolatile memory, the memory information is not lost even when the power supply is abruptly cut off. As the memory information is maintained even when the power supply is suddenly cut off, a backup memory is unnecessary, and the entire system can be made smaller.

Therefore, the nonvolatile memory circuit of each embodiment can be used as a logic-in-memory that is used for volatile memory backup.

The nonvolatile memory circuit of each embodiment can also be used as a memory of a circuit that utilizes a power-gating technique.

The nonvolatile memory circuit of each embodiment can also be used as a configuration memory of a FPGA (Field Programmable Gate Array).

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile memory circuit comprising:
a first p-channel spin MOS transistor including a first source/drain electrode and a second source/drain electrode, the first source/drain electrode being connected to a first wiring line;
a second p-channel spin MOS transistor including a third source/drain electrode and a fourth source/drain electrode, the third source/drain electrode being connected to the first wiring line, the fourth source/drain electrode being connected to a gate of the first p-channel spin MOS transistor, the second p-channel spin MOS transistor including a gate connected to the second source/drain electrode of the first p-channel spin MOS transistor;
a first n-channel MOS transistor including a fifth source/drain electrode and a sixth source/drain electrode, the fifth source/drain electrode being connected to a second wiring line, the sixth source/drain electrode being connected to the second source/drain electrode of the first p-channel spin MOS transistor, the first n-channel MOS transistor including a gate connected to the fourth source/drain electrode of the second p-channel spin MOS transistor;
a second n-channel MOS transistor including a seventh source/drain electrode and an eighth source/drain electrode, the seventh source/drain electrode being connected to the second wiring line, the eighth source/drain electrode being connected to the fourth source/drain electrode of the second p-channel spin MOS transistor, the second n-channel MOS transistor including a gate connected to the second source/drain electrode of the first p-channel spin MOS transistor;
a first p-channel MOS transistor including a ninth source/drain electrode and a tenth source/drain electrode, the ninth source/drain electrode being connected to the second source/drain electrode of the first p-channel spin MOS transistor, the tenth source/drain electrode being connected to a third wiring line, the first p-channel MOS transistor including a gate connected to a fourth wiring line; and
a second p-channel MOS transistor including an eleventh source/drain electrode and a twelfth source/drain electrode, the eleventh source/drain electrode being connected to the fourth source/drain electrode of the second p-channel spin MOS transistor, the twelfth source/drain electrode being connected to a fifth wiring line, the second p-channel MOS transistor including a gate connected to the fourth wiring line.

2. The circuit according to claim 1, wherein
a voltage of the first wiring line is set at a H-level, a voltage of the second wiring line is set at a L-level, a voltage of the fourth wiring line is set at the L-level, a voltage to be applied to one of the third and fifth wiring lines is set at the H-level, and a voltage to be applied to the other one of the third and fifth wiring lines is set at the L-level, and then
the voltage of the one of the third and fifth wiring lines is switched to the L-level, to cause a current to flow into one of the first and second p-channel spin MOS transistors, and perform writing on the one of the first and second p-channel spin MOS transistors.

3. The circuit according to claim 1, wherein
a voltage of the first wiring line is set at a H-level, a voltage of the second wiring line is set at a L-level, a voltage of the fourth wiring line is set at the L-level, a voltage to be applied to one of the third and fifth wiring lines is set at the H-level, and a voltage to be applied to the other one of the third and fifth wiring lines is set at the L-level, and then
the voltage of the first wiring line is switched to the L-level, to cause a current to flow into one of the first and second p-channel spin MOS transistors, and perform writing on the one of the first and second p-channel spin MOS transistors.

4. A nonvolatile memory circuit comprising:
a first p-channel MOS transistor including a first source/drain electrode and a second source/drain electrode, the first source/drain electrode being connected to a first wiring line;
a second p-channel MOS transistor including a third source/drain electrode and a fourth source/drain electrode, the third source/drain electrode being connected to the first wiring line, the fourth source/drain electrode being connected to a gate of the first p-channel MOS transistor, the second p-channel MOS transistor including a gate connected to the second source/drain electrode of the first p-channel MOS transistor;
a first n-channel MOS transistor including a fifth source/drain electrode and a sixth source/drain electrode, the fifth source/drain electrode being connected to a second wiring line, the sixth source/drain electrode being connected to the second source/drain electrode of the first p-channel MOS transistor, the first n-channel MOS transistor including a gate connected to the fourth source/drain electrode of the second p-channel MOS transistor;
a second n-channel MOS transistor including a seventh source/drain electrode and an eighth source/drain electrode, the seventh source/drain electrode being connected to the second wiring line, the eighth source/drain electrode being connected to the fourth source/drain electrode of the second p-channel MOS transistor, the second n-channel MOS transistor including a gate connected to the second source/drain electrode of the first p-channel MOS transistor;
a first p-channel spin MOS transistor including a ninth source/drain electrode and a tenth source/drain electrode, the ninth source/drain electrode being connected to the second source/drain electrode of the first p-channel MOS transistor, the tenth source/drain electrode being connected to a third wiring line, the first p-channel spin MOS transistor including a gate connected to a fourth wiring line; and
a second p-channel spin MOS transistor including an eleventh source/drain electrode and a twelfth source/drain electrode, the eleventh source/drain electrode being connected to the fourth source/drain electrode of the second p-channel MOS transistor, the twelfth source/drain electrode being connected to a fifth wiring line, the second p-channel spin MOS transistor including a gate connected to the fourth wiring line.

5. The circuit according to claim 4, wherein
a voltage of the first wiring line is set at a H-level, a voltage of the second wiring line is set at a L-level, a voltage of the fourth wiring line is set at the L-level, a voltage to be applied to one of the third and fifth wiring lines is set at the H-level, and a voltage to be applied to the other one of the third and fifth wiring lines is set at the L-level, and then the voltage of the one of the third and fifth wiring lines is switched to the L-level, or the voltage of the other one of the third and fifth wiring lines is switched to the H-level, to cause a current to flow into one of the first and second p-channel spin MOS transistors, and perform writing on the one of the first and second p-channel spin MOS transistors.

* * * * *